United States Patent [19]

Yamada

[11] Patent Number: 6,084,270

[45] Date of Patent: Jul. 4, 2000

[54] SEMICONDUCTOR INTEGRATED-CIRCUIT DEVICE HAVING N-TYPE AND P-TYPE SEMICONDUCTOR CONDUCTIVE REGIONS FORMED IN CONTACT WITH EACH OTHER

[75] Inventor: Takashi Yamada, Tokyo, Japan

[73] Assignee: NEC Corporation, Tokyo, Japan

[21] Appl. No.: 09/045,713

[22] Filed: Mar. 23, 1998

[30] Foreign Application Priority Data

Mar. 28, 1997 [JP] Japan ..................................... 9-077419

[51] Int. Cl.[7] .......................... H01L 27/01; H01L 27/12; H01L 31/0392
[52] U.S. Cl. ............................. 257/347; 257/691
[58] Field of Search .................... 257/347, 348, 257/349, 691

[56] References Cited

U.S. PATENT DOCUMENTS 5,359,219  10/1994  Hwang ..................................... 257/351
5,892,260   4/1999  Okumura et al. ........................ 257/347

FOREIGN PATENT DOCUMENTS 62-15852   1/1987   Japan .
3-222361  10/1991   Japan .

Primary Examiner—Sheila V. Clark
Attorney, Agent, or Firm—Young & Thompson

[57] ABSTRACT

With a simple structure without an increase in area, for minimizing fluctuations of potentials at a power line and ground line occurring during operation of a semiconductor integrated circuit having an SOI structure and improving heat dissipation efficiency and operational reliability, an SOI type semiconductor integrated-circuit device has an n-type semiconductor conductive region (39) and p-type semiconductor conductive region (37) formed under an embedded insulating layer (13) for insulating transistors (15p, 15n). A global power line (17) extending from the transistor (15p) is linked directly to the n-type conductive region (39) with no switch or the like between them. Likewise, a global ground line (19) extending from the transistor (15n) is linked directly to the p-type conductive region (37).

20 Claims, 4 Drawing Sheets

SEMICONDUCTOR INTEGRATED-CIRCUIT DEVICE HAVING N-TYPE AND P-TYPE SEMICONDUCTOR CONDUCTIVE REGIONS FORMED IN CONTACT WITH EACH OTHER

BACKGROUND OF THE INVENTION

The present invention relates to a semiconductor integrated-circuit device employing a silicon on insulator (SOI) substrate, and to an art for preventing a malfunction and a variation of an operating speed from occurring due to fluctuations of potentials at a power line and a ground line with a simple structure without an increase in area, and for further improving heat dissipation efficiency.

Semiconductor integrated-circuit devices including a bulk MOS device and SOI device are already known. Above all, the SOI device is a semiconductor integrated-circuit device having an SOI structure in which a p-channel MOS transistor and an n-channel MOS transistor are formed in a semiconductor layer formed on a p-type or an n-type semiconductor substrate with an embedding insulating layer (hereinafter, referred to as related art 1).

In the SOI type semiconductor integrated-circuit device according to related art 1, especially, the p-channel MOS transistor and n-channel MOS transistor are connected to a power line, a ground line, and a signal line and have the capability of an inverter circuit.

The SOI type semiconductor integrated-circuit device according to related art 1 gains an advantage over the conventional bulk CMOS device from the viewpoint that since the capacitance of a diffused layer can be made smaller, the time required for charging the signal line gets shorter accordingly and the operating speed gets higher. However, the capacitance of the diffused layer to be exerted between the power line and the ground line also gets smaller.

In general, in semiconductor integrated-circuit devices, when a large current flows at a time, for example, when an output buffer is driven, the potentials at a power line and a ground line readily fluctuate due to the impedances of lead wires and bonding wires.

However, normally, in the conventional bulk CMOS device, a power line is also used to apply a voltage to an n-type well, and a ground line is also used to apply a voltage to a p-type well. The large capacitances of the wells work between the power line and ground line. The capacitances realize a bypass capacitor. In the bulk CMOS semiconductor integrated-circuit device, therefore, variations of potentials at the power line and ground line caused by a noise occurring during operation can be suppressed.

By contrast, in the SOI type semiconductor integrated-circuit device according to related art 1, a low-capacitance diffused layer is connected to the power line and the ground line. When the device is in operation, a supply potential and a ground potential are likely to vary for the structural reason. An event that the supply potential and the ground potential fluctuate is equivalent to an event that the supply voltage for the circuit varies transiently during the operation of the circuit. The operating speed of the circuit, therefore, varies greatly. At worst, the circuit may malfunction. In some SOI type semiconductor integrated-circuit devices, therefore, a ground line and semiconductor substrate are interconnected in order to fix the potential at the semiconductor substrate to the ground potential. Even in this case, the potential at a power line is liable to vary.

For solving the foregoing problem, an SOI type semiconductor integrated-circuit device has been proposed in Japanese Unexamined Patent Publication No. 3-222361 (hereinafter, referred to as related art 2). In the semiconductor integrated-circuit device according to related art 2, a p-channel MOS transistor and an n-channel MOS transistor are formed in a semiconductor layer formed on a semiconductor substrate with an embedded insulating layer. According to related art 2, the p-channel transistor is connected to a signal line and has the capability of an inverter circuit. A power line and a ground line are connected to two electrodes formed in the, embedded insulating layer, lying immediately below the transistors. The two electrodes are shaped like flat plates, and opposed mutually with a given space between them, thus realizing a capacitor. Owing to this structure, a large capacitance is exerted between the power line and ground line. Consequently, fluctuations of potentials at the power line and the ground line occurring during operation of the integrated circuit can be suppressed.

However, related art 2 has not revealed a method of creating electrodes in an embedded insulating layer. The insulating layer and the flat plate-like electrodes are layered alternately, and a monocrystalline semiconductor layer is formed on both of the insulating layer and the flat plate-like electrodes. This presumably leads to a drawback that the manufacturing process gets very complex and the manufacturing cost gets very high.

Moreover, related arts 1 and 2 as well as MOS semiconductor circuits have a problem that electrical characteristics, especially mobility, deteriorate because of heat dissipated during operation of transistors. For example, an on-state current decreases.

In particular, as far as the SOI device in accordance with related art 1 is concerned, the heat conductivity of the insulating layer, embedded insulating layer, immediately under the transistors is often so low that heat dissipation to the semiconductor substrate is achieved imperfectly. In other words, since the power line, the ground line, and the signal line are connected to the transistors, part of heat dissipated by the transistors is exhausted to a wiring. However, since the heat capacity of the wiring is small, heat dissipation is achieved imperfectly. Heat generated by the transistors is accumulated. The temperatures of the transistors rise during operation thereof. Consequently, the electrical characteristics of the MOS transistors deteriorate.

SUMMARY OF THE INVENTION

It is an object of the invention to reduce fluctuations of potentials at a power line and ground line connected to a semiconductor integrated circuit having an SOI structure with a simple structure without an increase an area.

It is another object of the present invention to improve the heat dissipation efficiency of a transistor and minimize deterioration of electrical characteristics.

According to the present invention, there is provided a semiconductor integrated-circuit device having a semiconductor integrated circuit portion formed in a semiconductor layer created on a semiconductor substrate base with an insulating layer between them in a semiconductor substrate. The semiconductor integrated circuit device comprises an n-type semiconductor conductive region, a p-^type semiconductor conductive region, a power line, and a ground line. The n-type and the p-type semiconductor conductive regions are formed in contact with each other under said insulating layer in the semiconductor substrate. The power line is extended from the semiconductor integrated circuit portion while the ground line is extended from the semiconductor integrated circuit portion. The power line is linked directly to the n-type semiconductor conductive region. The ground line is linked directly to the p-type semiconductor conductive region.

In the semiconductor integrated-circuit device according to the present invention, the semiconductor substrate preferably has an SOI structure Moreover, in the semiconductor integrated-circuit device according to the present invention, the semiconductor integrated circuit portion preferably has an n-type transistor and p-type transistor mutually connected and thus realizes an inverter circuit.

Moreover, in the semiconductor integrated-circuit device according to the present invention, the boundary surface between the n-type semiconductor conductive region and the p-type semiconductor conductive region preferably realizes a capacitor.

Moreover, in the semiconductor integrated-circuit device according to the present invention, preferably, the power line extending from the semiconductor integrated circuit is linked directly to the n-type semiconductor conductive region, and the ground line extending from the semiconductor integrated circuit is linked directly to the p-type semiconductor conductive region.

Furthermore, in the semiconductor integrated-circuit device according to the present invention, the n-type semiconductor conductive region and p-type semiconductor conductive region in the semiconductor integrated-circuit device are preferably layered on the semiconductor substrate or juxtaposed in contact with each other.

DESCRIPTION OF THE PREFERRED EMBODIMENTS

Prior to a comment on the embodiments of the present invention, a semiconductor integrated-circuit device in accordance with prior arts will be described with reference to FIGS. 1 to 3 for a better understanding of the present invention.

Figure 1:
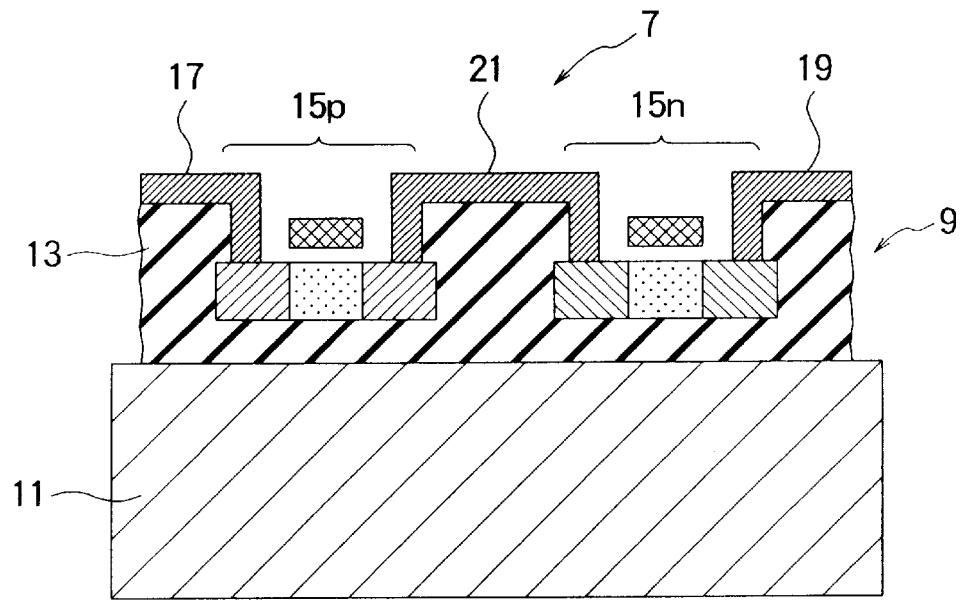
FIG. 1 is a sectional view showing the structure of an SOI type semiconductor integrated circuit device in accordance with a related art 1.
Figure 2:
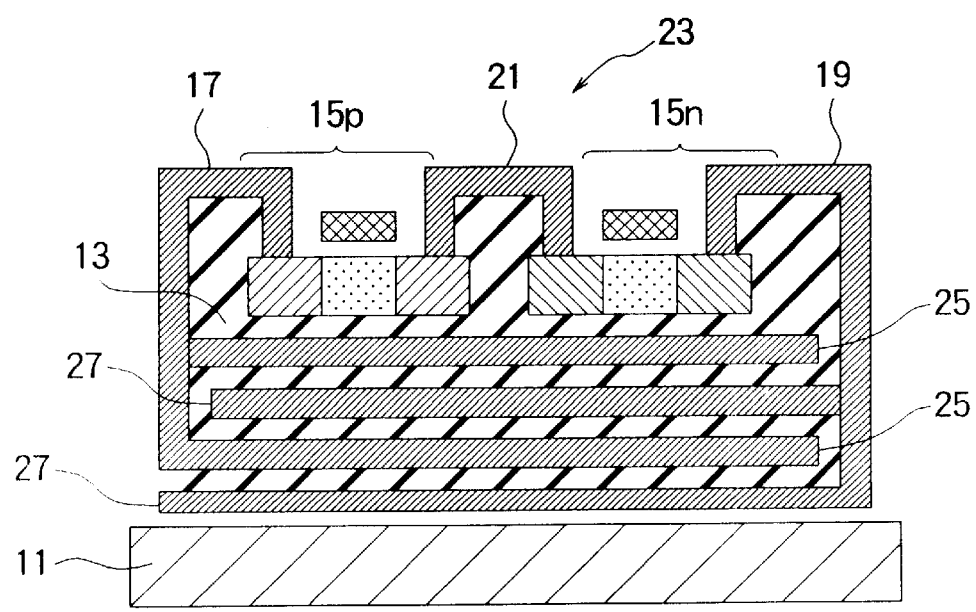
FIG. 2 is a sectional view showing the structure of an SOI type semiconductor integrated circuit device in accordance with the related prior art 2.
Figure 3:
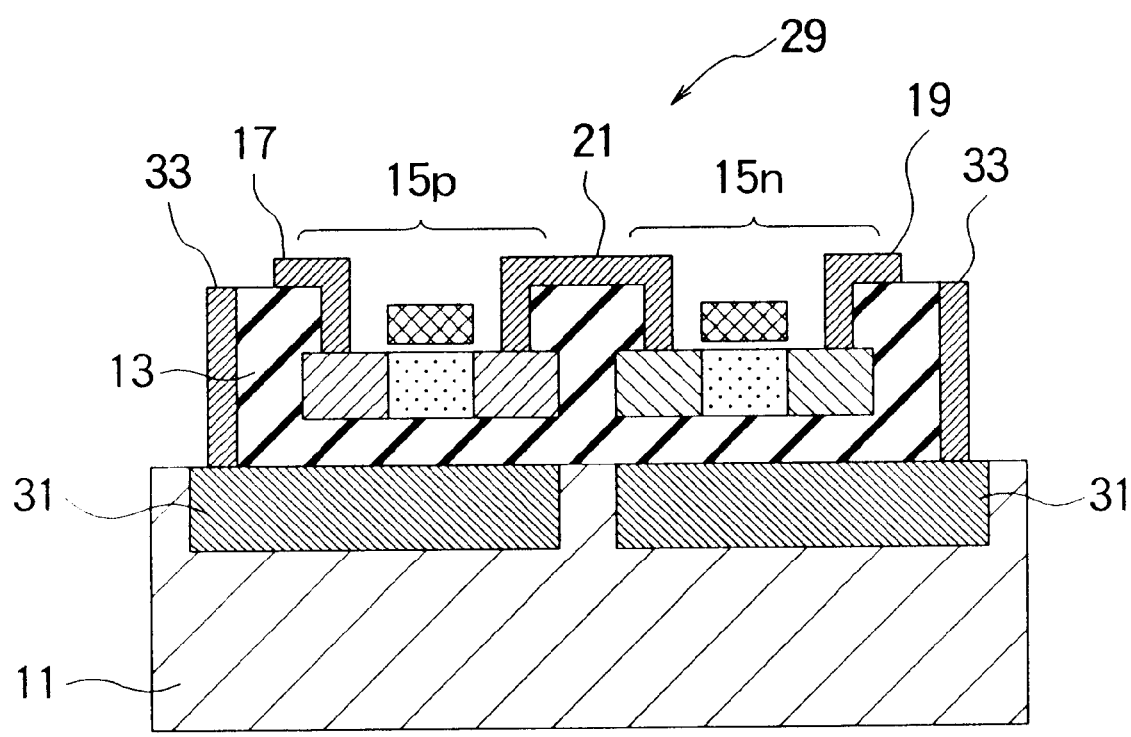
FIG. 3 is a sectional view showing the structure of an SOI type semiconductor integrated circuit device in accordance with the related art 3.

In FIGS. 1 to 3, the similar parts are designated by like reference numerals.

Referring to FIG. 1, a semiconductor integrated-circuit device 7 having an SOI structure in accordance with related art 1 comprises a p-type or an n-type semiconductor substrate base 11, and a semiconductor layer 9 on the semiconductor substrate base and having an embedded insulating layer 13, and all of which are formed in a p-type or an n-type substrate. In the semiconductor layer 9, a p-channel MOS transistor 15p and an n-channel MOS transistor 15n are formed. In this example, the p-channel MOS transistor 15p and an n-channel MOS transistor 15n are connected to a power line 17, a ground line 19, and a signal line 21, and thus have the capability of an inverter circuit.

FIG. 2 shows an SOI type semiconductor integrated circuit formed on the basis of the structure shown in FIG. 1 accompanying related art 2. Referring to FIG. 2, an SOI type semiconductor integrated circuit portion 23 has, for example, a p-channel MOS transistor 15p and an n-channel MOS transistor 15n formed in a semiconductor layer on a semiconductor substrate base 11 with an embedded insulating layer 13 and all of which are formed in a semiconductor substrate. In this example, the p-channel MOS transistor 15p and the n-channel MOS transistor 15n are connected to a power line 17, a ground line 19, and a signal line 21, and have the capability of an inverter circuit. The power line 17 and the ground line 19 are connected to electrodes 25 and 27 formed inside the embedded insulating layer 13 and located immediately under the transistors 15p and 15n. The electrodes 25 and 27 are shaped like flat plates and mutually opposed with a given space between them, thus realizing a capacitor. Owing to this structure, a large capacitance is exerted between the power line 17 and ground line 19. Consequently, fluctuations of potentials at the power line 17 and ground line 19 occurring during operation of the integrated circuit can be suppressed.

FIG. 3 is a diagram showing a structure formed on the basis of the structure shown in FIG. 3 accompanying Japanese Unexamined Patent Publication No. 7-106579 (hereinafter, referred to as related art 3). Differences of an SOI type semiconductor integrated circuit 29 shown in FIG. 3 from the SOI type semiconductor integrated circuit portion 23 according to related art 2 shown in FIG. 2 are as follows: a semiconductor substrate base 11 is of a p-type; and two n-type impurity regions 31 are formed in a subsurface layer of the semiconductor substrate base 11. The n-type impurity regions 31 are formed separately and positioned opposed at least to the channel regions of the transistors 15p and 15n through an insulating layer 13 of about 350 nm thickness. Electrodes 33 are extending from the n-type impurity regions. The electrodes 33 are realized with dedicated metallic wires for applying a back bias to the transistors 15p and 15n.

Now, the embodiments of the present invention will be described with reference to FIGS. 4 to 7. In the embodiment of the present invention, the similar parts are designated by like reference numerals as described in related arts with reference to FIGS. 1 to 3.

Figure 4:
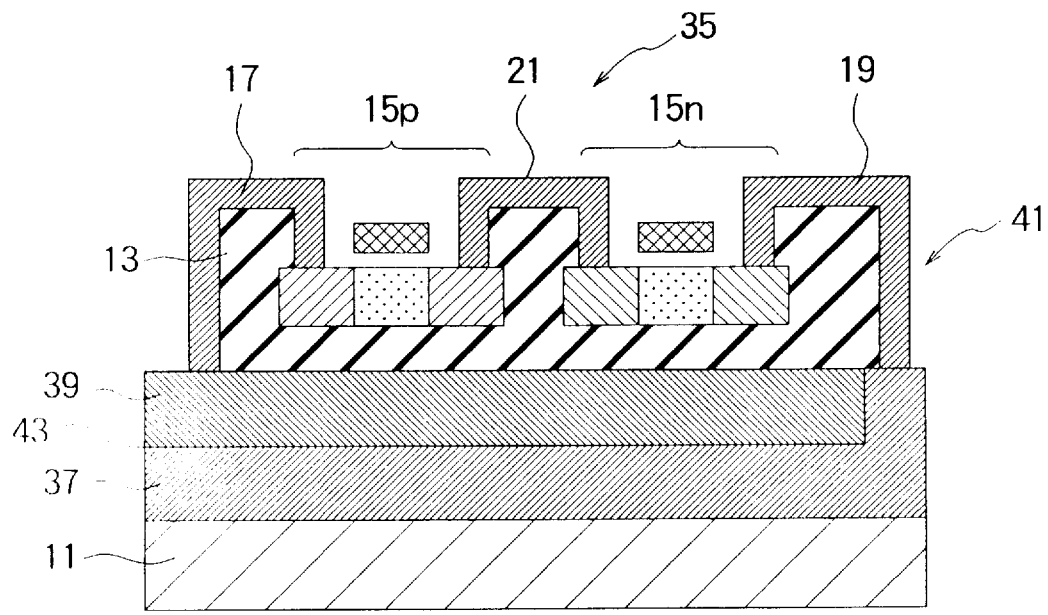
FIG. 4 is a sectional view showing the structure of an SOI type semiconductor integrated circuit device in accordance with the first embodiment of the present invention.

Referring to FIG. 4, an SOI type semiconductor integrated circuit device 35 in accordance with the first embodiment of the present invention is formed in a p-type or an n-type semiconductor substrate and comprises a p-type or an n-type semiconductor substrate 11, a p-type well 37 formed on the surface of the p-type or the n-type semiconductor substrate base 11, and an n-type well 39 formed on the boundary surface 43 of the p-type well 37. The p-type well 37 and n-type well 39 are formed according to a known high-energy ion implantation. A p-channel MOS transistor 15p and an n-channel MOS transistor 15n are formed in a semiconductor layer 41 created on the surface of the p-type well 37 with an insulating layer 13 between them. The insulating layer 13 has a thickness of about 1500 angstroms under channel regions of the p-type MOS and the n-channel MOS. Preferably, the thickness of the insulating layer may be within a range of 600 to 1500 angstroms or more in the other embodiment as described below. In this case, the p-channel MOS transistor 15p and the n-channel MOS transistor 15n are connected to a power line 17, a ground line 19, and a signal line 21, and have the capability of an inverter circuit. The power line 17 is linked to the n-type well 39 by a low-resistance conductor, such as a metallic wire, while the ground line 19 is linked to the p-type well 37 by a low-resistance conductor, such as a metallic wire.

The n-type well 39 is linked to the power line and the p-type well is linked to the ground line. Therefore, a reverse bias is applied to a pn junction that is boundary surface 43. This causes a depletion layer whose width is dependent on a supply voltage. The depletion layer works as a capacitor. This state is equivalent to a structure in which a bypass capacitor is connected between the power line 17 and the ground line 19. What has been mentioned is the principles of the present invention enabling suppression of variations of potentials at the power line and the ground line occurring during operation of the circuit.

If an impedance working between the power line 17 and bypass capacitor or between the ground line 19 and bypass capacitor is too large, the effect of suppressing potential variations cannot be exerted fully. According to the present invention, therefore, the power line 17 and the n-type well 39, and the ground line 19 and the p-type well 37 are linked directly at a low resistance without an element acting as a switch formed with, for example, a MOS transistor interposed between them. From this viewpoint, the semiconductor device in accordance with the present invention is different from the one in accordance with related art 3. In the semiconductor integrated circuit according to related art 3, the n-type impurity regions must be located very closely to the channels for the operational reason. The portions of the insulating layer immediately under the channel regions are therefore thin. Moreover, the n-type regions must be formed in the subsurface layer of the substrate. By contrast, the present invention is not dominated by these conditions.

In the semiconductor integrated circuit device 35 according to the first embodiment of the present invention shown in FIG. 4, the transistors 15p and 15n are connected to the semiconductor substrate base 11 via the power line 17 and the ground line 19 and all of which are formed in a semiconductor substrate.

In general, a material made into the insulating layer 13, such as SiO2, well adopted for semiconductor integrated circuits offers low heat conductivity. Heat generated by the transistors 15p and 15n is hardly dissipated to the surroundings through the insulating layer 13. Especially in an SOI type semiconductor integrated circuit device, since the insulating layer 13 exists between the transistors 15p and 15n and the semiconductor substrate base 11, heat dissipation during operation of the transistors is achieved imperfectly. Heat is accumulated in the transistors. Generally, when an MOS transistor is operated at a room temperature, as the temperature rises, the carrier mobility deteriorates. This causes an on-state current to decrease.

However, in the semiconductor integrated circuit device in accordance with the embodiment of the present invention shown in FIG. 4, heat dissipation paths linking the transistors to the semiconductor substrate are realized with the wires offering high heat conductivity. Consequently, heat accumulation in the transistors can be avoided.

Figure 5:
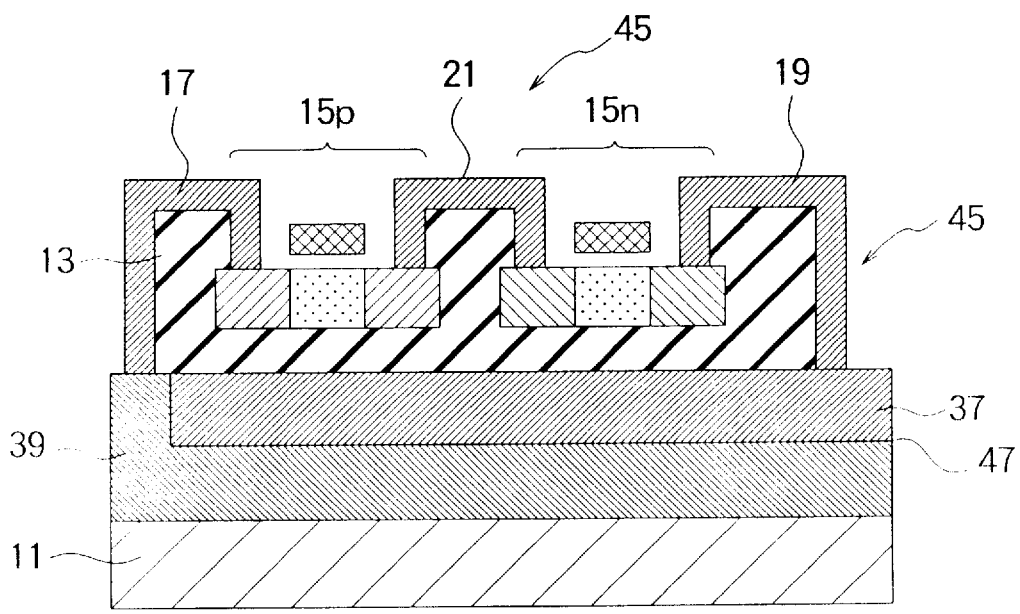
FIG. 5 is a sectional view showing the structure of an SOI type semiconductor integrated circuit device in accordance with the second embodiment of the present invention.

Referring to FIG. 5, a semiconductor integrated-circuit device 45 in accordance with the second embodiment of the present invention has the same structure as the semiconductor integrated-circuit device in accordance with the first embodiment shown in FIG. 4 except a point that a p-type well 37 is formed in the subsurface layer of an n-type well 39. The structure that what is linked to a power line 17 is the n-type well 39, and what is linked to a ground line 19 is the p-type well 37 is adopted in common among this embodiment and the first embodiment as well as the other embodiments of the present invention.

Figure 6:
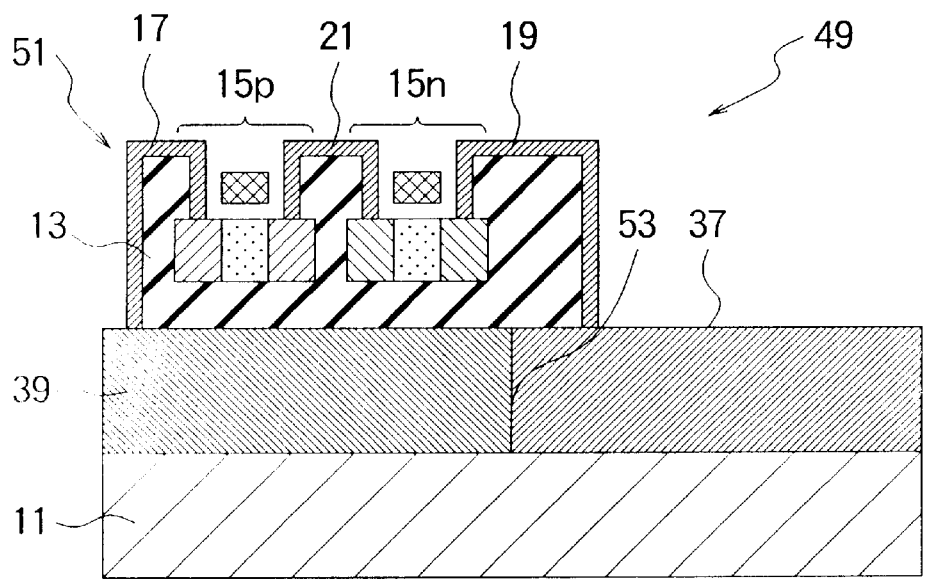
FIG. 6 is a sectional view showing the structure of an SOI type semiconductor integrated circuit device in accordance with the third embodiment of the present invention.

Referring to FIG. 6, a semiconductor integrated-circuit device 49 in accordance with the third embodiment of the present invention has the same structure as the semiconductor integrated-circuit device 35 in accordance with the first embodiment except a point that an n-type well 39 is formed under a region 51 in which transistors exist, and a p-type well 37 is formed in a place in which no transistor exists, such as, a wiring region.

According to the present invention, the depletion layer in the immediately vicinity of the boundary surface 43, 47, or 53 between the n-type well 39 and the p-type well 37 is utilized as a capacitor. As long as the boundary surface 43, 47, or 53 can be defined widely, the areas of the n-type well 39 and the p-type well 37 may be greatly different from each other.

Figure 7:
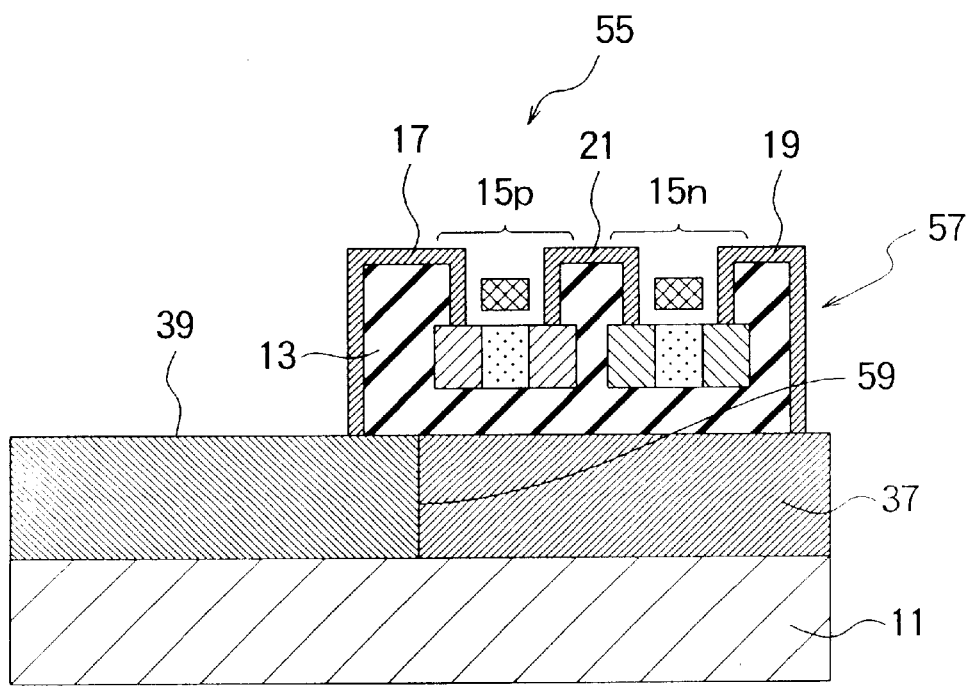
FIG. 7 is a sectional view showing the structure of an SOI type semiconductor integrated circuit device in accordance with the fourth embodiment of the present invention.

Referring to FIG. 7, a semiconductor integrated-circuit device in accordance with the fourth embodiment of the present invention is identical to the semiconductor integrated-circuit device 35 in accordance with the first embodiment except a point that a p-type well 37 is formed under a region 57 in which transistors exist and an n-type well 39 is formed in a region in which no transistor exists.

In the semiconductor integrated-circuit devices according to the first to fourth embodiments, the wells are formed on the surface of the semiconductor substrate 11, immediately under the embedded insulating layer. Alternatively, a structure in which wells exist at positions far from the surface of the semiconductor substrate, at deep positions will do.

As mentioned above by use of the embodiment, according to the present invention, a large capacitance realizing a bypass capacitor is exerted between a power line 17 and a ground line 19. This brings about an advantage that fluctuations of potentials at the power line 17 and the ground line 19 occurring during operation of the integrated circuit device 35, 45, 49, and 55 can be suppressed.

According to the present invention, a capacitor is realized on the side of a semiconductor substrate base 11 according to the high-energy ion implantation but not realized inside an embedded insulating layer 13. The capacitance can therefore be exerted relatively readily.

Furthermore, according to the present invention, heat can be dissipated from transistors 15p, 15n to a semiconductor substrate base 11 by way of a power line 17 and a ground line 19. Consequently, the electrical characteristics of the transistors 15p, 15n can be prevented from deteriorating due to heat generated during operation of the transistors 15p, 15n.

What is claimed is:

1. A semiconductor integrated-circuit device having a semiconductor integrated circuit portion formed in a semiconductor layer created on a semiconductor substrate base with an insulating layer between them in a semiconductor substrate, said device comprising an n-type semiconductor conductive region, a p-type semiconductor conductive region, a power line, and a ground line, said n-type semiconductor conductive region and said p-type semiconductor conductive region being formed in contact with each other under said insulating layer in said semiconductor substrate, said power line being extended from said semiconductor integrated circuit portion while said ground line is extended from said semiconductor integrated circuit portion, said power line being linked directly to said n-type semiconductor conductive region, said ground line being linked directly to said p-type semiconductor conductive region.

2. A semiconductor integrated-circuit device according to claim 1, wherein said semiconductor substrate has an SOI structure.

3. A semiconductor integrated-circuit device according to claim 1, wherein said semiconductor integrated circuit portion has an inverter circuit including an n-type transistor and a p-type transistor connected mutually.

4. A semiconductor integrated-circuit device according to claim 1, wherein the boundary surface between said n-type semiconductor conductive region and said p-type semiconductor conductive region realizes a capacitor.

5. A semiconductor integrated-circuit device according to claim 1, wherein said n-type semiconductor conductive region and said p-type semiconductor conductive region are stacked on said semiconductor substrate.

6. A semiconductor integrated-circuit device according to claim 5, wherein said p-type semiconductor conductive region is stacked on said semiconductor substrate, said n-type semiconductor conductive region being stacked on said p-type semiconductor conductive region.

7. A semiconductor integrated-circuit device according to claim 5, wherein said n-type semiconductor conductive region is stacked on said semiconductor substrate, said p-type semiconductor conductive region being stacked on said n-type semiconductor conductive region.

8. A semiconductor integrated-circuit device according to claim 5, wherein said n-type semiconductor conductive region and said p-type semiconductor conductive region are juxtaposed in contact with each other on said semiconductor substrate.

9. A semiconductor integrated-circuit device according to claim 8, wherein said semiconductor integrated circuit is formed on said n-type semiconductor conductive region.

10. A semiconductor integrated-circuit device according to claim 8, wherein said semiconductor integrated circuit is formed on said p-type semiconductor conductive region.

11. A semiconductor integrated-circuit device according to claim 1, wherein said insulating layer has a thickness greater than 600 angstroms.

12. A semiconductor integrated circuit device according to claim 1, further comprising p-type and n-type transistors, each of which having a channel region, each of said channel regions being remote from said n-type semiconductor conductive region with the insulating layer interposed between said channel regions and the n-type semiconductor conductive region.

13. A semiconductor circuit, comprising:

a substrate comprising a base with an insulating layer thereon and a first conductivity type conductive region and second conductivity type conductive region between said base and said insulating layer, said insulating layer having a circuit formed thereon, said circuit having a power line and a ground line connected thereto;

said first and second conductivity type conductive regions being in direct contact with each other at an interface that is a p-n junction; and said power line being connected to said first conductivity type conductive region and said ground line being connected to said second conductivity type conductive region, said power line and said ground line being linked to each other across the circuit and across the p-n junction.

14. The circuit of claim 13, wherein one of said first and second conductivity type conductive regions is directly atop the other of said first and second conductivity type conductive regions.

15. The circuit of claim 13, wherein said first and second conductivity type conductive regions are next to each other at one level between said base and said insulating layer.

16. The circuit of claim 13, wherein said power line and said first conductivity type conductive region are each directly connected to a first metallic wire that traverses said insulating layer.

17. The circuit of claim 13, wherein said ground line and said second conductivity type conductive region are each directly connected to a second metallic wire that traverses said insulating layer.

18. The circuit of claim 17, wherein said power line and said first conductivity type conductive region are each directly connected to a first metallic wire that traverses said insulating layer.

19. The device of claim 1, wherein said power line is connected to said n-type semiconductor conductive region with a metallic wire that traverses said insulating layer.

20. The device of claim 1, wherein said ground line is connected to said p-type semiconductor conductive region with a metallic wire that traverses said insulating layer.

* * * * *